United States Patent
Kim et al.

(10) Patent No.: US 9,991,245 B2
(45) Date of Patent: Jun. 5, 2018

(54) SEMICONDUCTOR PACKAGES WITH HEAT DISSIPATION LAYERS AND PILLARS AND METHODS FOR FABRICATING THE SAME

(71) Applicants: Jae Choon Kim, Incheon (KR); Donghan Kim, Osan-si (KR); Jikho Song, Seoul (KR); Mitsuo Umemoto, Seongnam-si (KR); Inho Choi, Seoul (KR)

(72) Inventors: Jae Choon Kim, Incheon (KR); Donghan Kim, Osan-si (KR); Jikho Song, Seoul (KR); Mitsuo Umemoto, Seongnam-si (KR); Inho Choi, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days. days.

(21) Appl. No.: 14/958,928

(22) Filed: Dec. 3, 2015

(65) Prior Publication Data
US 2016/0204080 A1    Jul. 14, 2016

(30) Foreign Application Priority Data

Jan. 8, 2015  (KR) ........................ 10-2015-0002873

(51) Int. Cl.
*H01L 23/495*  (2006.01)
*H01L 23/10*  (2006.01)
(Continued)

(52) U.S. Cl.
CPC ............ *H01L 25/50* (2013.01); *H01L 23/367* (2013.01); *H01L 23/49811* (2013.01);
(Continued)

(58) Field of Classification Search
CPC . H01L 25/0657; H01L 21/4882; H01L 25/50; H01L 21/4825; H01L 23/3107; H01L 21/4842; H01L 23/4952; H01L 23/367; H01L 2225/06589; H01L 2225/06555; H01L 2225/06544;
(Continued)

(56) References Cited

U.S. PATENT DOCUMENTS 5,633,783 A    5/1997 Yamamoto
8,017,437 B2   9/2011 Yoo et al.
(Continued)

FOREIGN PATENT DOCUMENTS

KR    101086972 B1    11/2011
KR    101096455 B1    12/2011
(Continued)

*Primary Examiner* — Kimberly Rizkallah
*Assistant Examiner* — Dilinh Nguyen
(74) *Attorney, Agent, or Firm* — Renaissance IP Law Group LLP

(57) ABSTRACT

A semiconductor package comprising: a semiconductor chip; a connection pillar that is disposed adjacent to the semiconductor chip; a first heat dissipation layer disposed on the semiconductor chip; and a second heat dissipation layer disposed on the first heat dissipation layer, the second heat dissipation layer including a first protrusion extending beyond a perimeter of the semiconductor chip and extending towards the connection pillar.

10 Claims, 13 Drawing Sheets

(51) Int. Cl.
*H01L 23/34* (2006.01)
*H01L 25/00* (2006.01)
*H01L 23/367* (2006.01)
*H01L 23/00* (2006.01)
*H01L 25/10* (2006.01)
*H01L 23/498* (2006.01)
H01L 23/31 (2006.01)
H01L 23/538 (2006.01)

(52) U.S. Cl.
CPC ............. *H01L 24/19* (2013.01); *H01L 24/20* (2013.01); *H01L 25/105* (2013.01); *H01L 23/3128* (2013.01); *H01L 23/5389* (2013.01); *H01L 24/29* (2013.01); *H01L 24/32* (2013.01); *H01L 24/48* (2013.01); *H01L 24/73* (2013.01); *H01L 24/92* (2013.01); *H01L 2224/04105* (2013.01); *H01L 2224/12105* (2013.01); *H01L 2224/2919* (2013.01); *H01L 2224/32225* (2013.01); *H01L 2224/32245* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/94* (2013.01); *H01L 2224/97* (2013.01); *H01L 2225/1035* (2013.01); *H01L 2225/1058* (2013.01); *H01L 2225/1076* (2013.01); *H01L 2225/1094* (2013.01); *H01L 2924/0002* (2013.01); *H01L 2924/00014* (2013.01); *H01L 2924/1431* (2013.01); *H01L 2924/1436* (2013.01); *H01L 2924/1438* (2013.01); *H01L 2924/15311* (2013.01); *H01L 2924/181* (2013.01); *H01L 2924/1815* (2013.01)

(58) Field of Classification Search
CPC ... H01L 23/10; H01L 23/49568; H01L 23/36; H01L 23/34; H01L 23/40; H01L 23/4012; H01L 23/49811; H01L 24/19; H01L 24/20; H01L 25/105
USPC ................................ 257/675, 712, 713, 706
See application file for complete search history.

(56) References Cited

U.S. PATENT DOCUMENTS

| | | | |
|---|---|---|---|
| 8,441,120 B1* | 5/2013 | Arcedera | H01L 23/433 257/706 |
| 2005/0104195 A1* | 5/2005 | Yang | H01L 23/3128 257/706 |
| 2008/0258293 A1 | 10/2008 | Yang et al. | |
| 2010/0052164 A1 | 3/2010 | Lee et al. | |
| 2010/0087035 A1 | 4/2010 | Yoo et al. | |
| 2012/0032340 A1* | 2/2012 | Choi | H01L 21/561 257/774 |
| 2012/0241935 A1 | 9/2012 | Chou et al. | |
| 2013/0277821 A1 | 10/2013 | Lundberg | |
| 2014/0084442 A1 | 3/2014 | Lee et al. | |
| 2014/0097533 A1 | 4/2014 | Liu et al. | |
| 2014/0159222 A1* | 6/2014 | Hong | H01L 23/13 257/686 |
| 2015/0115467 A1* | 4/2015 | Park | H05K 1/141 257/774 |
| 2016/0071779 A1* | 3/2016 | Chen | H01L 24/97 257/787 |

FOREIGN PATENT DOCUMENTS

| | | |
|---|---|---|
| KR | 101099583 B1 | 12/2011 |
| KR | 101214746 B1 | 12/2012 |
| KR | 101236798 B1 | 2/2013 |
| KR | 1020140094081 A | 7/2014 |
| KR | 101445964 B1 | 9/2014 |

\* cited by examiner

SEMICONDUCTOR PACKAGES WITH HEAT DISSIPATION LAYERS AND PILLARS AND METHODS FOR FABRICATING THE SAME

CROSS-REFERENCE TO RELATED APPLICATIONS

This U.S. nonprovisional patent application claims priority under 35 U.S.C. § 119 of Korean Patent Application 10-2015-0002873 filed on Jan. 8, 2015, the entire contents of which are hereby incorporated by reference.

BACKGROUND

Embodiments relate to a semiconductor package and, more particularly, to a package-on-package type semiconductor package including a wafer level package as a bottom package.

Semiconductor packages have evolved in various directions aiming for compactness, lightness and cost reduction. Moreover, types of packages are also diversified with variety of applications. A ball grid array (BGA) package may be formed by mounting a semiconductor chip on an integrated circuit board, molding the semiconductor chip, and attaching solder balls under the integrated circuit board. The molding structure and the integrated circuit board are necessary to fabricate the BGA package and as a result, there are limits to reduce the thickness of the semiconductor package.

Wafer level packages (WLP) are designed to solve demerits of the BGA package. In the wafer level package process, a redistribution pattern is formed on a bottom side of a semiconductor chip without the molding step and then solder balls are attached to the redistribution pattern. Because the process for the wafer level package does not require a molding structure and an integrated circuit board, it is possible to reduce the thickness of a wafer level package. However, the wafer level package has disadvantages in adhesion of solder balls, handling, and test due to its small size.

Fan-out wafer level packages have been developed to solve these disadvantages. In processes for the fan-out wafer level packages, a molding layer is provided around the semiconductor chip and the redistribution pattern is formed on a bottom side of the molding layer to attach solder balls thereto.

SUMMARY

An embodiment includes a semiconductor package comprising: a semiconductor chip; a connection pillar that is disposed adjacent to the semiconductor chip; a first heat dissipation layer disposed on the semiconductor chip; and a second heat dissipation layer disposed on the first heat dissipation layer, the second heat dissipation layer including a body and a first protrusion projecting toward the connection pillar from a sidewall of the body.

A method for fabricating a semiconductor package, the method comprising: forming a first heat dissipation layer on a semiconductor chip; forming a preliminary heat dissipation layer including a body disposed on the first heat dissipation layer, a protrusion projecting from a sidewall of the body, and a pillar section in contact with the protrusion and not in contact with the body; and removing a portion of the protrusion to define a second heat dissipation layer including the body and define a connection pillar that includes the pillar section and is spaced apart from the second heat dissipation layer.

A semiconductor package, comprising: a bottom semiconductor package, comprising: a semiconductor chip; a connection pillar that is disposed adjacent to the semiconductor chip; a first heat dissipation layer disposed on the semiconductor chip; and a second heat dissipation layer disposed on the first heat dissipation layer, the second heat dissipation layer including a body and a first protrusion projecting toward the connection pillar from a sidewall of the body; a top semiconductor package disposed on the bottom semiconductor package; and a connection member electrically connected between connection pillar of the bottom semiconductor package and the top semiconductor package.

BRIEF DESCRIPTION OF THE DRAWINGS

The foregoing and other features and advantages of embodiments will be apparent from the detailed description of particular embodiments, as illustrated in the accompanying drawings in which like reference characters refer to the same parts throughout the different views. The drawings are not necessarily to scale, emphasis instead being placed upon illustrating the principles of the embodiments. In the drawings:

FIGS. 2A to 7A illustrate plan views of a method for fabricating a stacked semiconductor package according to an embodiment;

FIGS. 2B to 7B illustrate cross-sectional views of a method for fabricating a stacked semiconductor package according to an embodiment taken along lines I-I' of FIGS. 2A to 7A respectively;

DETAILED DESCRIPTION OF EMBODIMENTS

Figure 1A:
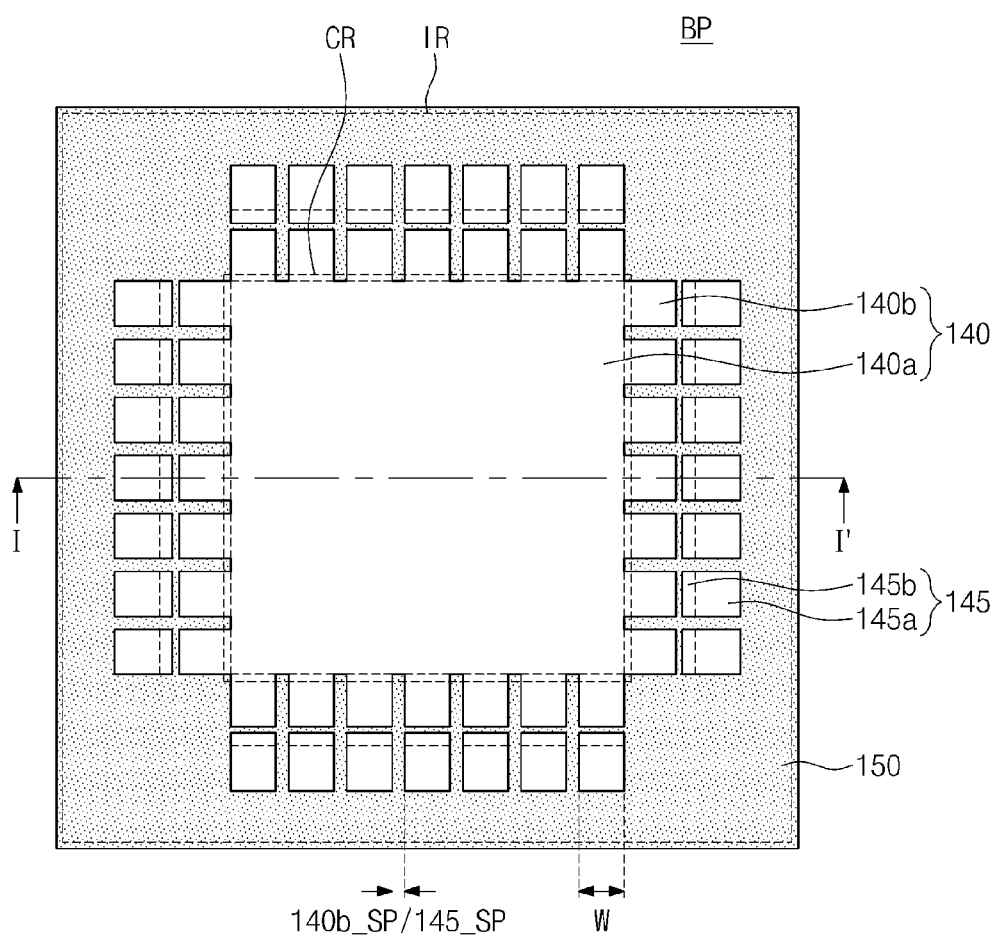
FIG. 1A illustrates a plan view of a bottom semiconductor package included in a stacked semiconductor package according to an embodiment.

Embodiments will now be described more fully hereinafter with reference to the accompanying drawings, in which some particular embodiments are shown. Embodiments, may, however, take many different forms and should not be construed as being limited to the particular embodiments set forth herein; rather, these embodiments are provided so that this disclosure will be thorough and complete, and will fully convey the scope of the embodiments to those of ordinary skill in the art. In the drawings, the thicknesses of layers and regions are exaggerated for clarity. Like reference numerals in the drawings denote like elements.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope.

Relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, embodiments will be described with reference to the accompanying drawings. In the accompanying drawings, the modifications of the illustrated shapes may be expected according to manufacturing technologies and/or tolerance. Therefore, embodiments should not be construed as being limited to specific shapes of the illustrated regions. The shapes may be changed during the manufacturing processes. Accordingly, various dimensions may be referred to as being substantially the same and encompass both the dimensions being identical and the dimensions being different due to manufacturing variations. The following embodiments may be combined.

Figure 1B:
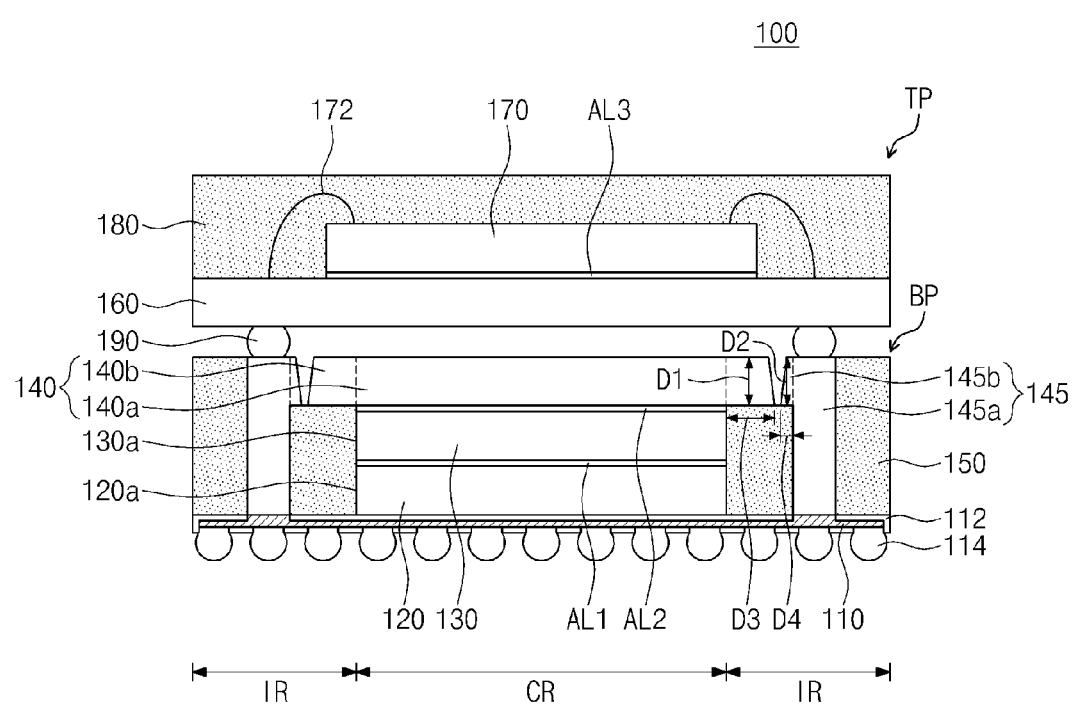
FIG. 1B illustrates a cross-sectional view of a stacked semiconductor package according to an embodiment taken along line I-I' of FIG. 1A.

FIG. 1A illustrates a plan view of a bottom semiconductor package included in a stacked semiconductor package according to an embodiment. FIG. 1B illustrates a cross-sectional view of a stacked semiconductor package according to an embodiment taken along line I-I' of FIG. 1A. Referring to FIGS. 1A and 1B, a stacked semiconductor package 100 may comprise a bottom semiconductor package BP, a top semiconductor package TP, and multiple connection members 190.

The bottom semiconductor package BP may include a redistribution pattern 110, a lower semiconductor chip 120, a first heat dissipation layer 130, a second heat dissipation layer 140, multiple connection pillars 145, and a lower molding layer 150.

The redistribution pattern 110 may include a chip region CR occupying a central area thereof and an interconnection region IR surrounding the chip region CR. A lower insulating layer 112 may be disposed to partially cover the redistribution pattern 110 and expose portions of top and bottom surfaces of the redistribution pattern 110. Multiple external terminals 114 such as solder balls may be disposed on the exposed bottom surface of the redistribution pattern 110. The redistribution pattern 110 may include a conductive material such as a metal or an alloy; for example, copper (Cu), aluminum (Al), nickel (Ni), platinum (Pt), silver (Ag), gold (Au), or any combination thereof. The lower insulating layer 112 may include an inorganic dielectric layer such as silicon oxide layer, silicon nitride layer, silicon oxynitride layer, or an organic dielectric layer such as polyimide.

The lower semiconductor chip 120 may be disposed on the chip region CR of the redistribution pattern 110. The lower semiconductor chip 120 may be electrically connected to the redistribution pattern 110. For example, in the chip region CR, the lower semiconductor chip 120 may be connected to the exposed top surface of the redistribution pattern 110. Although the lower insulating layer 112 is illustrated as being disposed between the redistribution pattern 110 and the lower semiconductor chip 120, openings (not shown) in the lower insulating layer 112 between the redistribution pattern 110 and the lower semiconductor chip 120 may expose portions of the top surface of the redistribution pattern 110. The lower semiconductor chip 120 may be a logic chip such as a system-on-chip (SOC) or any other semiconductor device.

The first heat dissipation layer 130 may be disposed on the lower semiconductor chip 120. A first adhesive layer AL1 may be interposed between the lower semiconductor chip 120 and the first heat dissipation layer 130 such that the first heat dissipation layer 130 may be fixed on the lower semiconductor chip 120. A sidewall 130a of the first heat dissipation layer 130 may be coplanar or vertically aligned with a sidewall 120a of the lower semiconductor chip 120. The first heat dissipation layer 130 may include a relatively high thermal conductivity material. For example, the first dissipation layer 130 may include copper (Cu), aluminum (Al), nickel (Ni), platinum (Pt), silver (Ag), gold (Au), or any combination thereof. The first adhesive layer AL1 may include an insulating double-sided adhesive tape, an insulating glue layer, or the like.

The second heat dissipation layer 140 may be disposed on the first heat dissipation layer 130. A second adhesive layer AL2 may be interposed between the first heat dissipation layer 130 and the second heat dissipation layer 140 such that the second heat dissipation layer 140 may be fixed on the first heat dissipation layer 130. The second heat dissipation layer 140 may include a relatively high thermal conductivity material. For example, the second dissipation layer 140 may include copper (Cu), aluminum (Al), nickel (Ni), platinum (Pt), silver (Ag), gold (Au), or any combination thereof. The second adhesive layer AL2 may include an insulating double-sided adhesive tape, an insulating glue layer, or the like.

The second heat dissipation layer 140 may include a body 140a and multiple first protrusions 140b. The body 140a may occupy a central portion of the second heat dissipation layer 140 and the first protrusions 140b may project from a sidewall of the body 140a. For example, the first protrusions 140b may be finger-like portions projecting outward from the body 140a. The body 140a may be disposed in the chip region CR. At least a portion of the second heat dissipation layer 140 may extend onto the interconnection region IR. In some embodiments, the first protrusions 140b may extend onto the interconnection region IR. The second heat dissipation layer 140 may have an area greater than that of the lower semiconductor chip 120, in a plan view. The second heat dissipation 140 may also have an area greater than that of the first heat dissipation layer 130, in a plan view. In some embodiments, the second heat dissipation layer 140 may extend beyond a perimeter of one or both of the lower semiconductor chip 120 and the first heat dissipation layer 130, in a plan view.

The connection pillars 145 may lie on the interconnection region IR. Each of the connection pillars 145 may be adjacent to the first protrusions 140b. The connection pillars 145 may pair with the first protrusions 140b in a one-to-one correspondence. In other words, each of the first protrusions 140b may project toward corresponding one of the connection pillars 145; however, in other embodiments, the first protrusions 140b and the connection pillars 145 may not be disposed on a one-to-one basis.

The connection pillars 145 may be spaced apart from the first protrusions 140b. The connection pillars 145 may be electrically connected to the redistribution pattern 110. For example, in the interconnection region IR, the connection pillars 145 may be connected to the exposed top surface of the redistribution pattern 110. The connection pillars 145 may include a relatively high thermal conductivity material. For example, the connection pillars 145 may include copper (Cu), aluminum (Al), nickel (Ni), platinum (Pt), silver (Ag), gold (Au), or any combination thereof.

In some embodiments, each of the connection pillars 145 may comprise a pillar section 145a and a second protrusion 145b. The pillar section 145a may vertically extend from the top surface of the redistribution pattern 110. The pillar section 145a may extend at least to the same level as a top surface of the second heat dissipation layer 140. In some embodiments, the pillar section 145a may extend from a top surface of the connection pillar 145 to the same level as a top surface of the second heat dissipation layer 140. The second protrusion 145b may project toward the second heat dissipation layer 140 from a sidewall of the pillar section 145a. The second protrusion 145b may be disposed on a top portion of the pillar section 145a and positioned at the same level as the first protrusion 140b. As such, each of the first protrusions 140b may face corresponding one of the second protrusions 145b and may be spaced apart from the corresponding one of the second protrusions 145b. Each of the second protrusions 145b may have a thickness D2 substantially identical or similar to a thickness D1 of the first protrusion 140b. In some embodiments, each of the first protrusions 140b may have a length D3 greater than a length D4 of the second protrusion 145b.

Alternatively, each of the connection pillars 145 may have the pillar section 145a without the second protrusion 145b.

The lower molding layer 150 may cover the redistribution pattern 110 and the lower semiconductor chip 120. In some embodiments, the lower molding layer 150 may cover the top surface of the redistribution pattern 110, the sidewall 120a of the lower semiconductor chip 120, the sidewall 130a of the first heat dissipation layer 130, at least a portion of a sidewall of the second heat dissipation layer 140, and at least a portion of a sidewall of the connection pillar 145. The lower molding layer 150 may not cover oppositely facing sidewalls of the first protrusion 140b and the second protrusion 145b. The lower molding layer 150 may expose top surfaces of the second heat dissipation layer 140 and the connection pillars 145. The lower molding layer 150 may include, for example, an epoxy molding compound.

The top semiconductor package TP may be disposed on the bottom semiconductor package BP. The top semiconductor package TP may include an upper package substrate 160, an upper semiconductor chip 170, and an upper molding layer 180.

The upper package substrate 160 may be disposed on the bottom semiconductor package BP. The upper package substrate 160 may be a printed circuit board, a flexible printed circuit board, or other substrate on which a semiconductor chip may be mounted.

The upper semiconductor chip 170 may be mounted on the upper package substrate 160. The upper semiconductor chip 170 may be electrically connected to the upper package substrate 160. In some embodiments, as shown in FIG. 1B, multiple bonding wires 172 may be disposed to electrically connect the upper semiconductor chip 170 to the upper package substrate 160. A third adhesive layer AL3 may be interposed between the upper semiconductor chip 170 and the upper package substrate 160 such that the upper semiconductor chip 170 may be fixed on the upper package substrate 160. Alternatively, the upper semiconductor chip 170 may be mounted on the upper package substrate 160 in the manner of flip-chip bonding. The upper semiconductor chip 170 may be any semiconductor device such as, for example, a memory device such as DRAM, NAND Flash, NOR flash, OneNAND, PRAM, ReRAM, or MRAM. The third adhesive layer AL3 may include an insulating double-sided adhesive tape, an insulating glue layer, or the like.

The upper molding layer 180 may encapsulate the upper package substrate 160 and the upper semiconductor chip 170. As shown in FIG. 1B, if the top semiconductor package TP includes the bonding wires 172, the upper molding layer 180 may further encapsulate the bonding wires 172. The upper molding layer 180 may include, for example, an epoxy molding compound.

The connection members 190 may be interposed between the bottom semiconductor package BP and the top semiconductor package TP such that the bottom semiconductor package BP may be electrically connected to the top semiconductor package TP. In detail, the connection members 190 may be respectively disposed on the connection pillars 145 so as to electrically connect the connection pillars 145 to the upper package substrate 160. The connection members 190 may be solder balls.

The stacked semiconductor package 100 may include the second heat dissipation layer 140 whose area is greater than that of the lower semiconductor chip 120, in a plan view, thereby enhancing heat dissipation characteristics of the bottom semiconductor package BP.

In an embodiment, a connection pillar 145 and a first protrusion 140b may be substantially the same width W. As will be described in further detail below, a connection pillar 145 and a first protrusion 140b may be part of the same structure before a cutting operation is performed. Furthermore, a separation (145_SP) between adjacent connection pillars 145 may be substantially the same as a separation (140b_SP) between the corresponding first protrusions 140b.

Figure 1C:
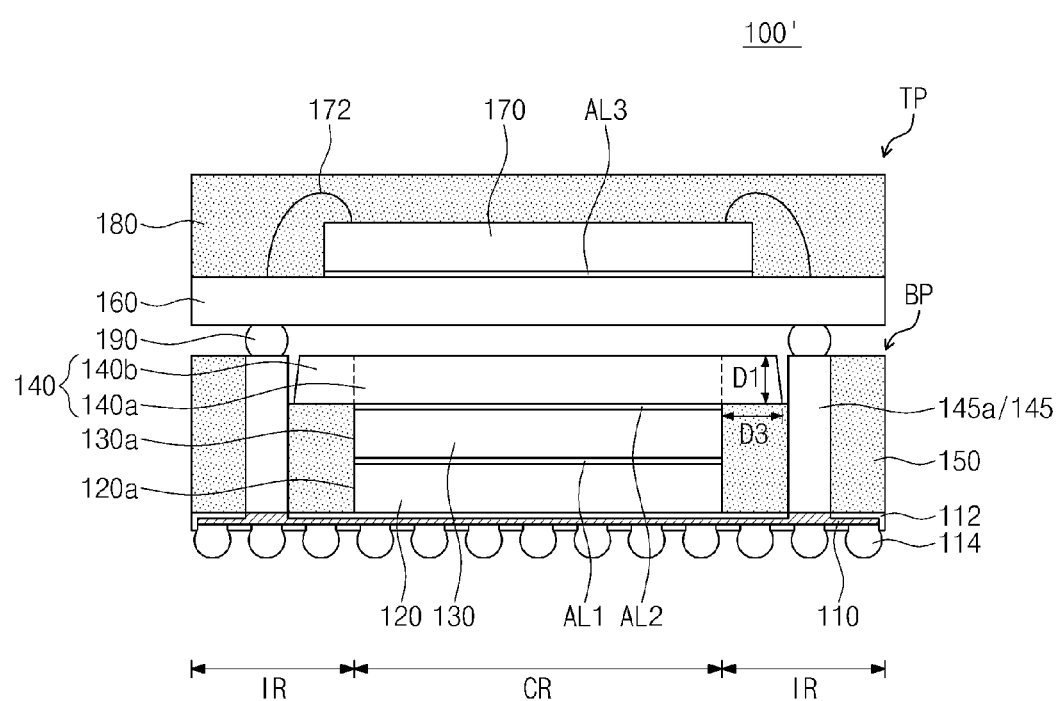
FIGS. 1C-1E illustrates a cross-sectional view of a stacked semiconductor package according to various embodiments.
Figure 1D:
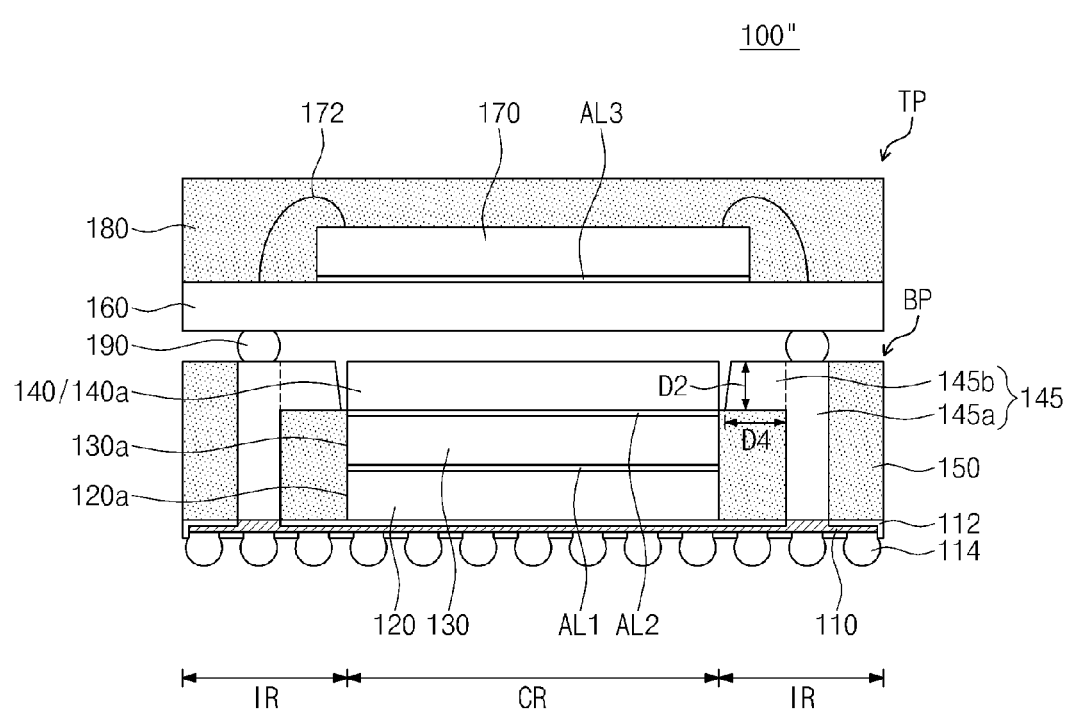
Figure 1E:
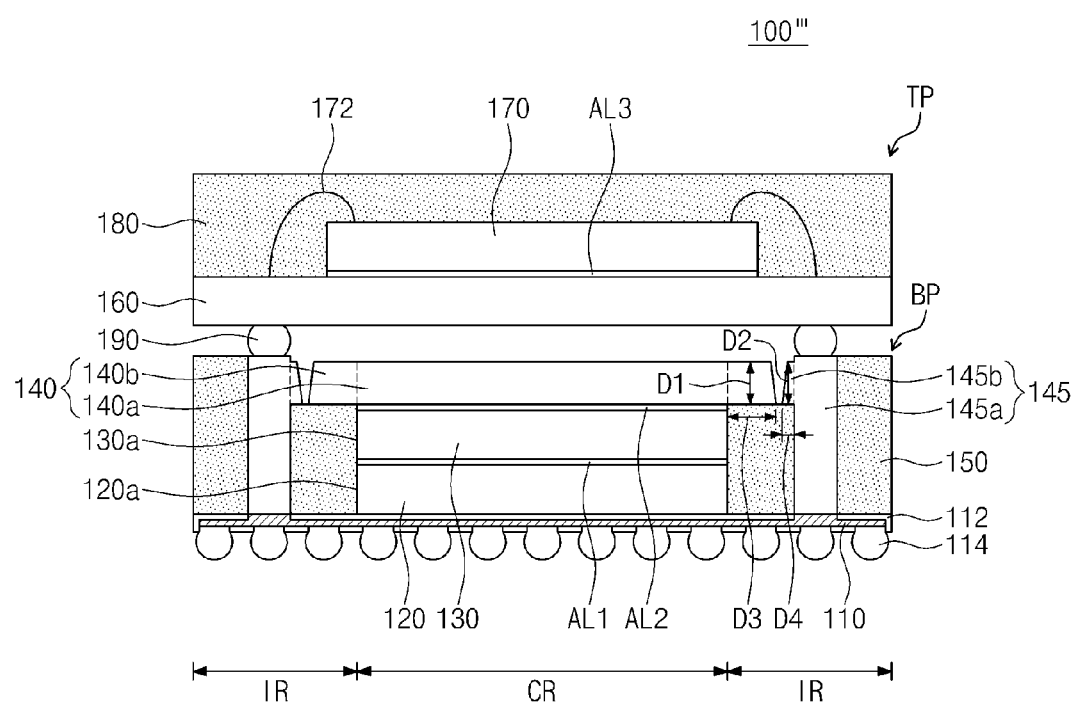

FIGS. 1C-1E illustrates a cross-sectional view of a stacked semiconductor package according to various embodiments. Referring to FIG. 1C, the stacked semiconductor package 100' may be similar to the stacked semiconductor package 100 described above. However, in this embodiment, the connection pillar 145 does not include a second protrusion 145b.

Referring to FIG. 1D, the stacked semiconductor package 100'' may be similar to the stacked semiconductor package 100 described above. However, in this embodiment, the second heat dissipation layer 140 may not include a first protrusion 140b. The second protrusion 145b of the connection pillar 145 may extend towards the second heat dissipation layer 140 and, in particular, extend towards the body 140a of the second heat dissipation layer 140.

Referring to FIG. 1E, the stacked semiconductor package 100''' may be similar to the stacked semiconductor package 100 described above. However, in this embodiment, the second heat dissipation layer 140 has a top surface that is located at different level from a top surface of the connection pillar 145. In particular, the top surface of the second heat dissipation layer 140 is located at a lower level than the top surface of the connection pillar 145.

FIGS. 2A to 7A illustrate plan views of a method for fabricating a stacked semiconductor package according to an embodiment. FIGS. 2B to 7B illustrate cross-sectional views of a method for fabricating a stacked semiconductor package according to an embodiment, taken along lines I-I' of FIGS. 2A to 7A respectively. The method will be discussed below with reference to FIGS. 2A to 7A and 2B to 7B. The description of features that are the same as or similar to those in FIGS. 1A and 1B may be omitted in order to avoid repetition, and previously described elements may be identified by identical reference numbers.

Figure 2A:
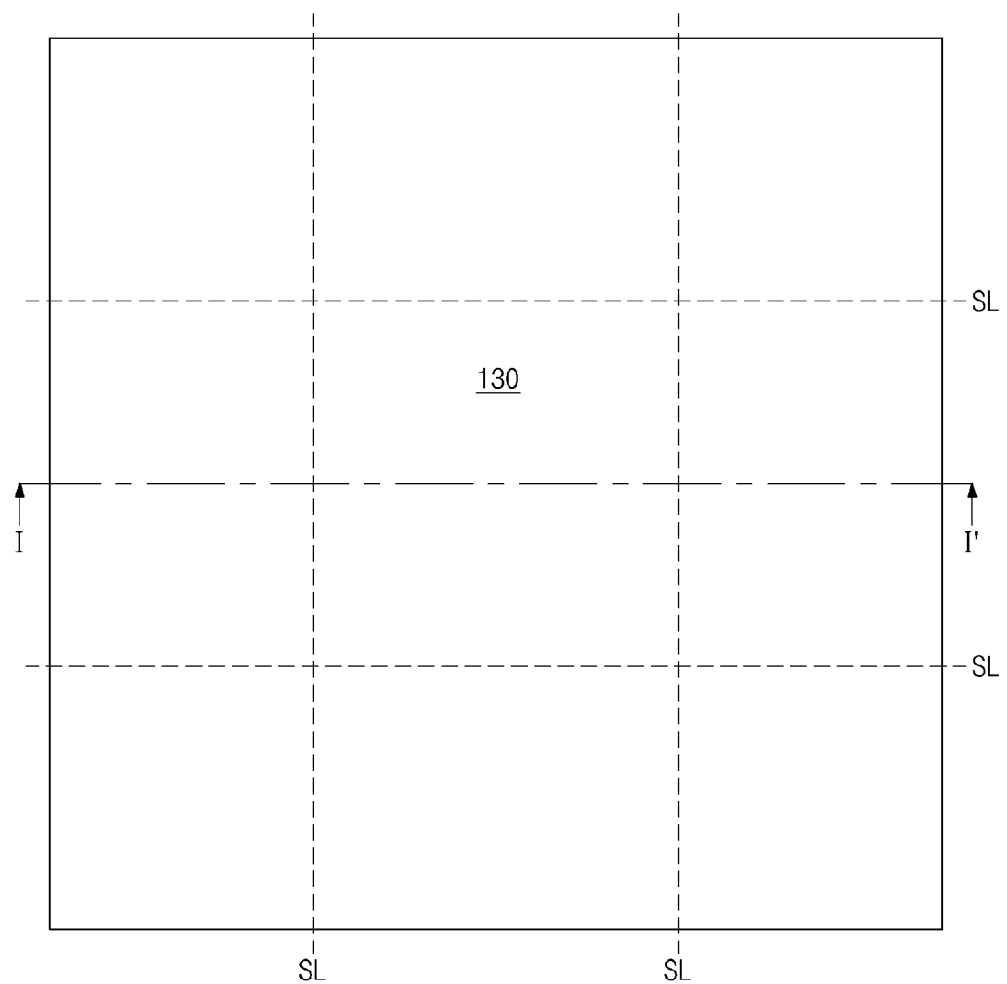
Figure 2B:
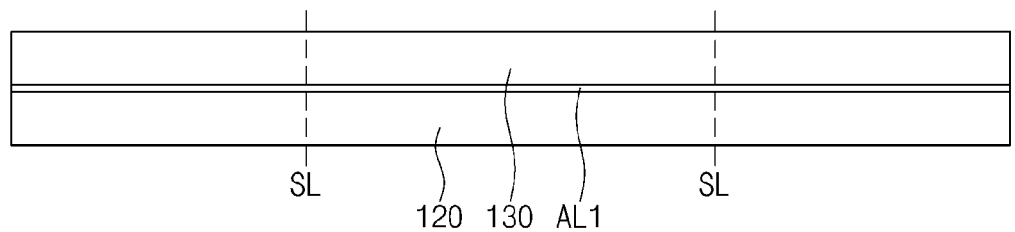
Figure 3A:
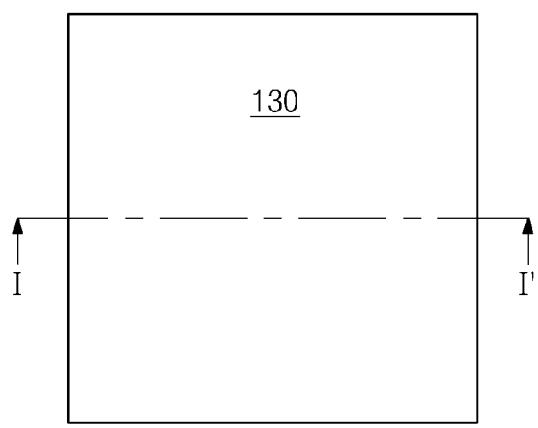
Figure 3B:
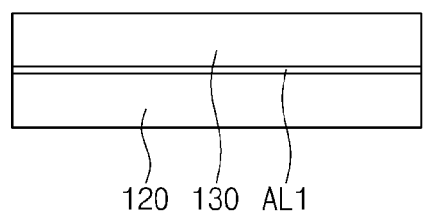

Referring to FIGS. 2A, 2B, 3A and 3B, a first heat dissipation layer 130 may be formed on a lower semiconductor chip 120. The first heat dissipation layer 130 may be fixed on the lower semiconductor chip 120 by a first adhesive layer AL1. In some embodiments, the formation of the first heat dissipation layer 130 may comprise forming the first heat dissipation layer 130 on a wafer including multiple the lower semiconductor chips 120 formed thereon, as shown in FIGS. 2A and 2B, and then dicing the wafer along scribe lanes SL to separate the lower semiconductor chips 120 from each other, as shown in FIGS. 3A and 3B.

Figure 4A:
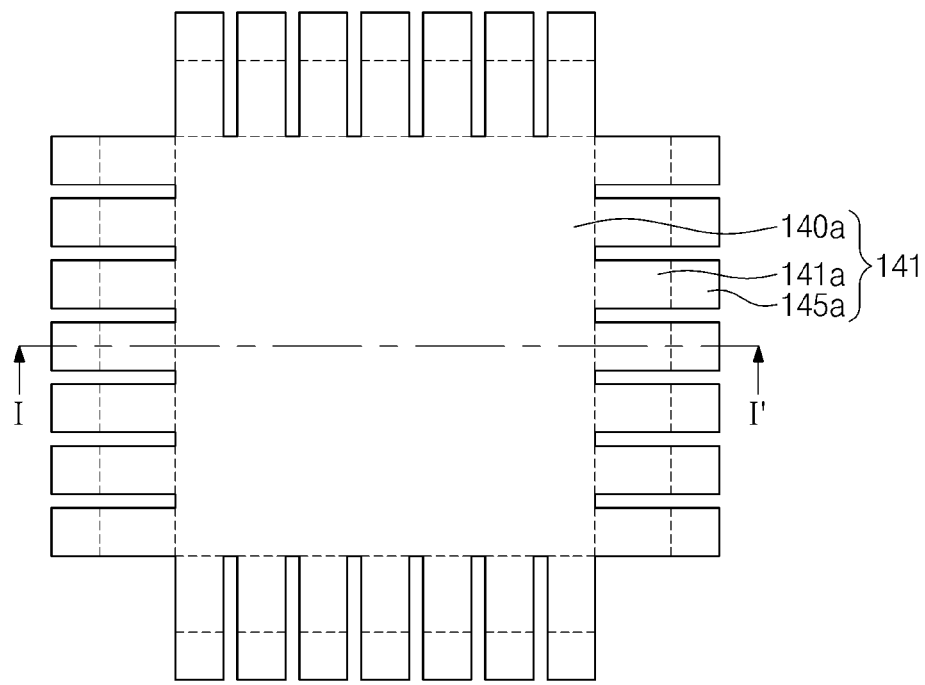
Figure 4B:
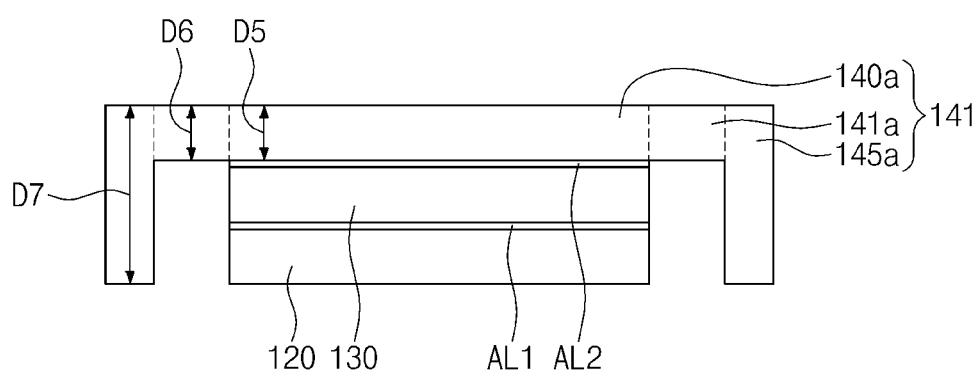

Referring to FIGS. 4A and 4B, a preliminary heat dissipation layer 141 may be formed to include a body 140a, protrusions 141a, and pillar sections 145a. The body 140a may occupy a central portion of the preliminary heat dissipation layer 141, and the protrusions 141a may be parts projected from a sidewall of the body 140a. For example, the protrusions 141a may be finger-like portions projecting outward from the body 140a. The pillar sections 145a may contact sidewalls of the protrusions 141a and be thicker than the body 140a and the protrusion 141a. The body 140a and the pillar sections 145a may be oppositely disposed with respect to the protrusions 141a such that the body 140a may have no contact with the pillar sections 145a. In some embodiments, the body 140a may have a thickness D5 substantially the same as a thickness D6 of the protrusion 141a. However, as discussed above, the pillar 145 may have a thickness D7 greater than a thickness D5 of the body 140a and a thickness D6 of the protrusion 141a. The body 140a may have a top surface substantially coplanar with top surfaces of the protrusion 141a and the pillar section 145a such that the pillar section 145a may have a bottom surface lower than bottom surfaces of the body 140a and the protrusion 141a.

For example, the preliminary heat dissipation layer 141 may be formed by casting, and the body 140a of the preliminary heat dissipation layer 141 may be fixed on the first heat dissipation layer 130 via the second adhesive layer AL2. The body 140a may vertically overlap the lower semiconductor chip 120. On the other hand, at least a portion of the protrusion 141a may not vertically overlap the lower semiconductor chip 120. The pillar sections 145a may surround the lower semiconductor chip 120 without overlapping the lower semiconductor chip 120 in a plan view. The bottom surface of the pillar section 145a may have a level substantially identical to that of a bottom surface of the lower semiconductor chip 120.

Figure 5A:
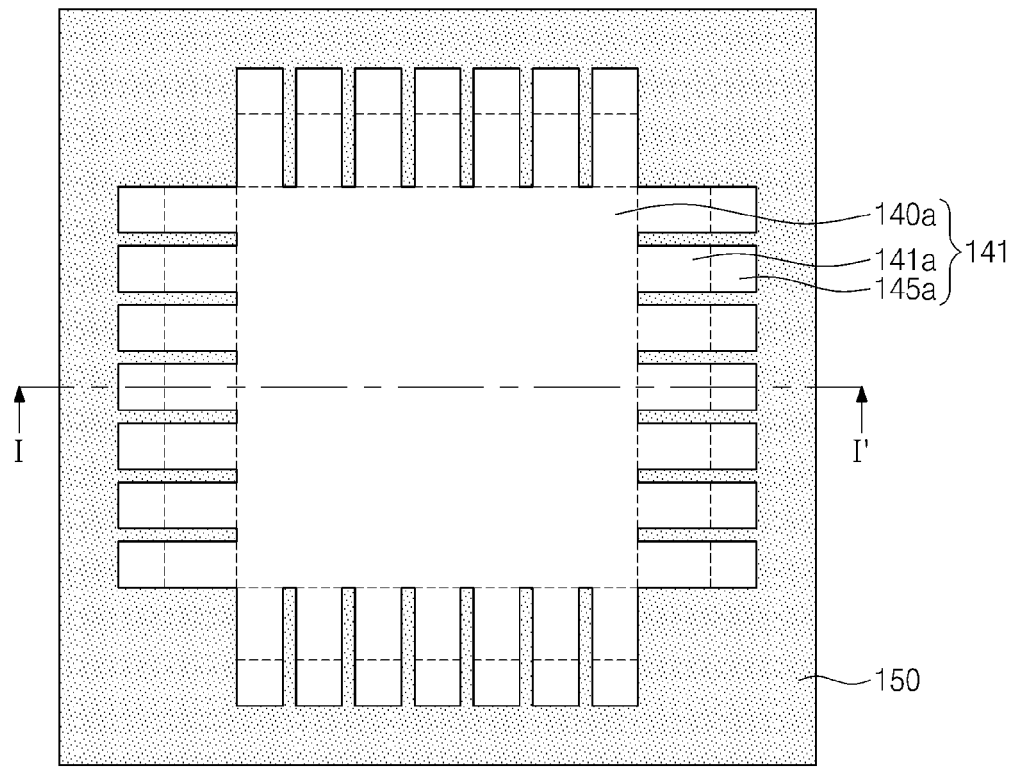
Figure 5B:
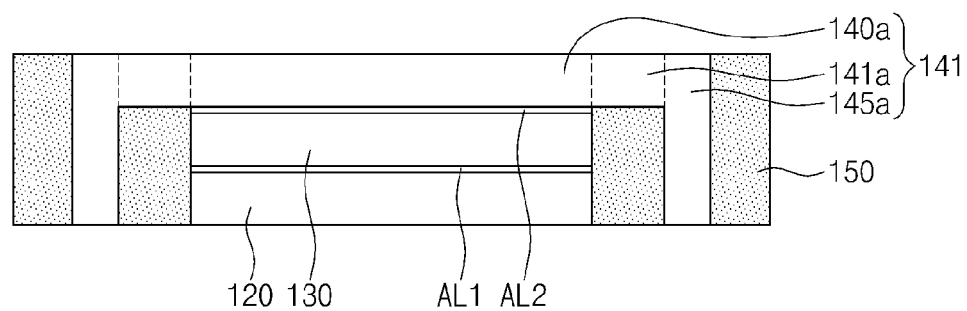

Referring to FIGS. 5A and 5B, a lower molding layer 150 may be formed. The lower molding layer 150 may cover a sidewall of the lower semiconductor chip 120, a sidewall of the first heat dissipation layer 130, and the preliminary heat dissipation layer 141. The lower molding layer 150 may, however, expose the bottom surface of the lower semiconductor chip 120, the bottom surfaces of the pillar sections 145a, and a top surface of the preliminary heat dissipation layer 141.

Figure 6A:
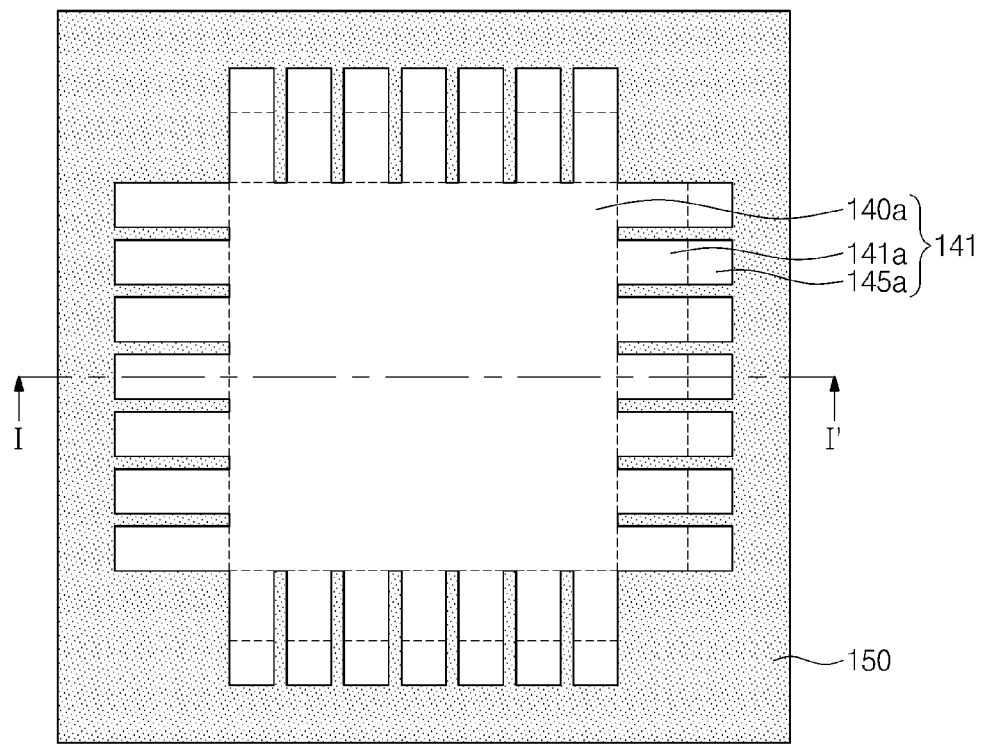
Figure 6B:
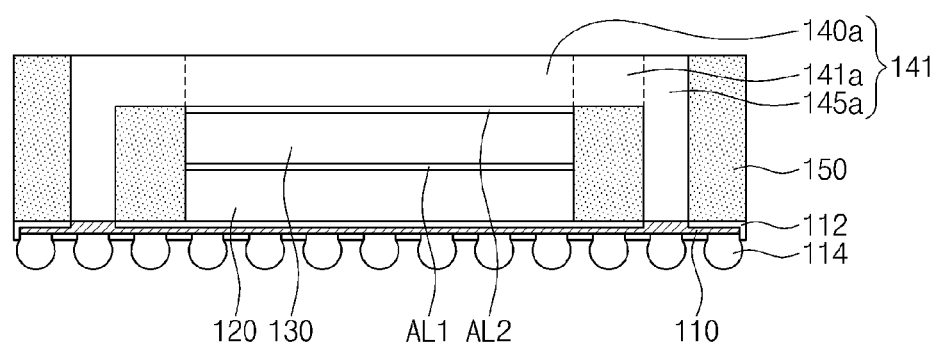

Referring to FIGS. 6A and 6B, a redistribution pattern 110 may be formed below the lower semiconductor chip 120, pillar sections 145a, and the lower molding layer 150. The redistribution pattern 110 may be electrically connected to the lower semiconductor chip 120 and the pillar sections 145a. The redistribution pattern 110 may be covered with a lower insulating layer 112. Formations of the redistribution pattern 110 and the lower insulating layer 112 may include repeatedly depositing and etching conductive and insulating materials. A bottom surface of the redistribution pattern 110 may be partially exposed through the lower insulating layer 112, and external terminals 114 such as solder balls may adhere to the exposed bottom surface of the redistribution pattern 110.

Figure 7A:
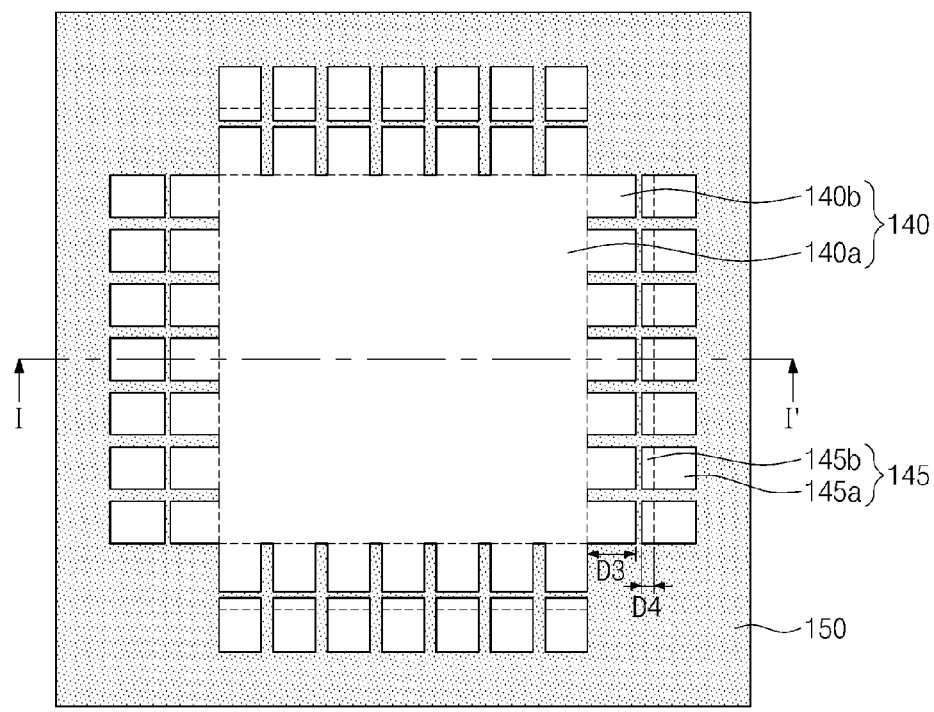
Figure 7B:
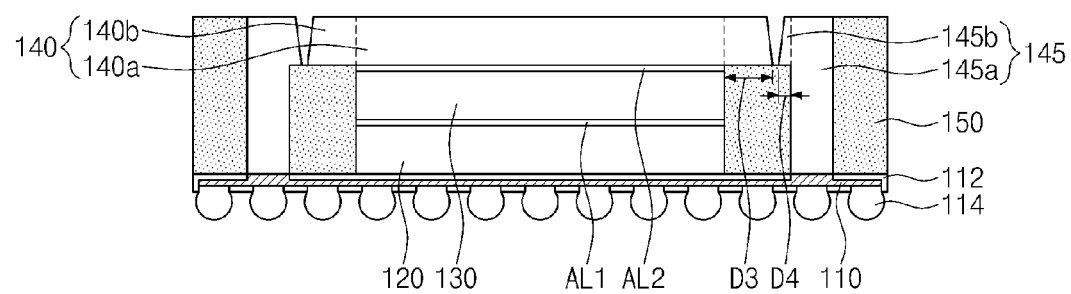

Referring to FIGS. 7A and 7B, each of the protrusions 141a of FIG. 6A or 6B may be partially removed to form a first protrusion 140b and a second protrusion 145b spaced apart from each other. The first protrusion 140b may be a portion of the protrusion 141a contacting the body 140a and the second protrusion 145b may be another portion of the protrusion 141a contacting the pillar section 145a. The first protrusion 140b may face the second protrusion 145b and may be spaced apart from the second protrusions 145b. The body 140a and the first protrusions 140b may be combined to define a second heat dissipation layer 140, and the pillar section 145a and the second protrusion 145b may be combined to define connection pillar 145. In some embodiments, the first protrusion 140b may have a length D3 greater than a length D4 of the second protrusion 145b. In a plan view, the second heat dissipation layer 140 may have an area greater than that of the lower semiconductor chip 120. The partial removal of the protrusion 141a may be performed using a laser cutting process.

A bottom semiconductor package BP may be formed using the method formerly discussed with reference to FIGS. 2A to 7A and FIGS. 2B to 7B.

Referring back to FIGS. 1A and 1B, a top semiconductor package TP may be mounted on the bottom semiconductor package BP. The top semiconductor package TP may include an upper package substrate 160, an upper semiconductor chip 170, and an upper molding layer 180. The mounting of the top semiconductor package TP may include electrically connecting the top semiconductor package TP to the connection pillars 145 via connection members 190 on the connection pillars 145.

According to an embodiment, in a plan view, the second heat dissipation layer 140 may have an area greater than that of the lower semiconductor chip 120. Consequently, the bottom semiconductor package BP may have superior heat dissipation characteristics.

Moreover, the formation of the pillar sections 145a which electrically connect the top semiconductor package TP to the redistribution pattern 110 may be performed in advance to the formation of the lower molding layer 150. It therefore may be easy to electrically connect the redistribution pattern 110 to the top semiconductor package TP, thereby reducing or eliminating poor electrical contact between the redistribution pattern 110 and the top semiconductor package TP.

Figure 8:
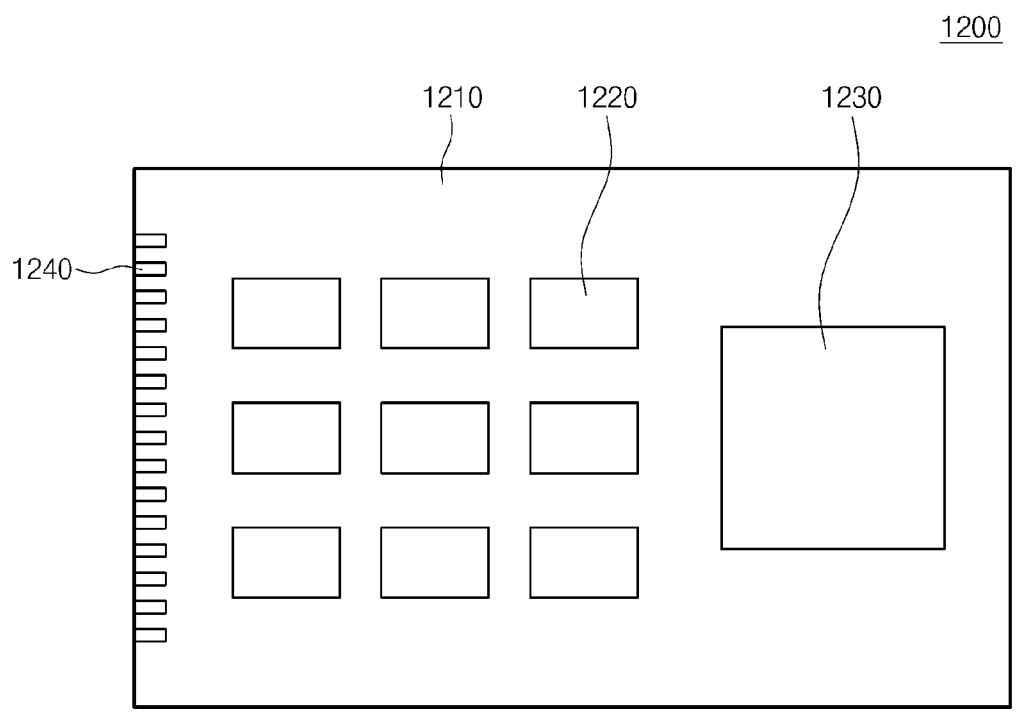
FIG. 8 illustrates an example of a package module including a semiconductor package according to an embodiment.

FIG. 8 illustrates an example of a package module including a semiconductor package according to an embodiment. Referring to FIG. 8, a package module 1200 may be in the form of a semiconductor integrated circuit chip 1220 and a semiconductor integrated circuit chip 1230 in which a QFP is packaged. The package module 1200 may be formed by installing the semiconductor devices 1220 and 1230, to which the technology of the semiconductor package according to an embodiment is applied, on a substrate 1210. The package module 1200 may be connected to an external electronic device through an external connection terminal 1240 provided on one side of the substrate 1210.

Figure 9:
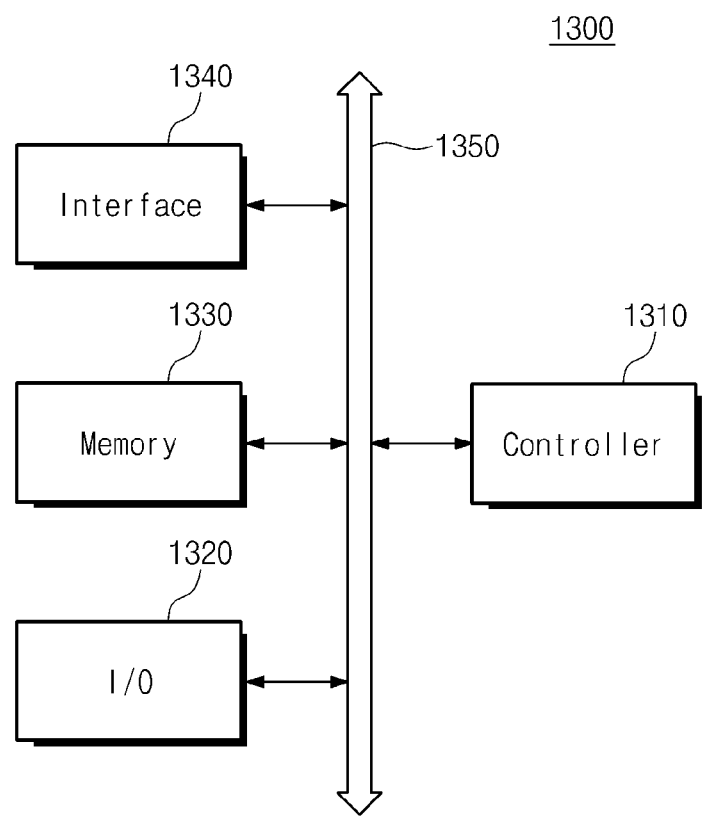
FIG. 9 illustrates a block diagram of an example of an electronic device including a semiconductor package according to an embodiment.

The above-described technology of a semiconductor package may be applied to an electronic system. FIG. 9 illustrates a block diagram of an example of an electronic device including a semiconductor package according to an embodiment.

Referring to FIG. 9, an electronic system 1300 may include a controller 1310, an input/output (I/O) device 1320, and a memory device 1330. The controller 1310, the I/O device 1320, and the memory device 1330 may be connected to each other through a bus 1350. The bus 1350 may be a transfer path for data. For example, the controller 1310 may include at least one of a microprocessor, a digital signal processor, and a microcontroller, or at least one logic device capable of performing similar functions. The controller 1310, I/O device 1320, and the memory device 1330, or any other device of the electronic system 1300 may include semiconductor packages according to embodiment. The I/O device 1320 may include at least one of a keypad, a keyboard, a display device, and the like. The memory device 1330 may be configured to store data. The memory device 1330 may be configured to store data and/or commands executed by the controller 1310. The memory device 1330 may include a volatile memory device and/or a nonvolatile memory device. The memory device 1330 may include a flash memory, as an example. In an embodiment, the flash memory may be mounted in an information processing system such as a mobile unit or a desktop computer. The flash memory may include a SSD (solid state disk). In this case, the electronic system 1300 may be capable of reliably storing a mass of data in the flash memory system. The electronic system 1300 may further include an interface 1340 configured to transmit data to a communication network or receiving data from the communication network. The interface 1340 may be in the form of a wired/wireless interface. For example, the interface 1340 may include an antenna or a wired/wireless transceiver. In addition, although not illustrated in the drawings, the electronic system 1300 may further include, e.g., an application chipset, a CIS (camera image processor), an input-output device, or other devices.

The electronic system 1300 may be realized by a mobile system, a personal computer, an industrial computer, or a logical system for performing various functions. For example, the mobile system may be a PDA (personal digital assistant), a portable computer, a web tablet, a mobile phone, a wireless phone, a laptop computer, a memory card, a digital music system, or an information transmitting/receiving system. In the case where the electronic system 1300 is an equipment capable of performing a wireless communication, the electronic system 1300 may be used via a communication interface protocol of a third generation communication system, such as CDMA, GSM, NADC, E-TDMA, WCDAM, or CDMA2000.

Figure 10:
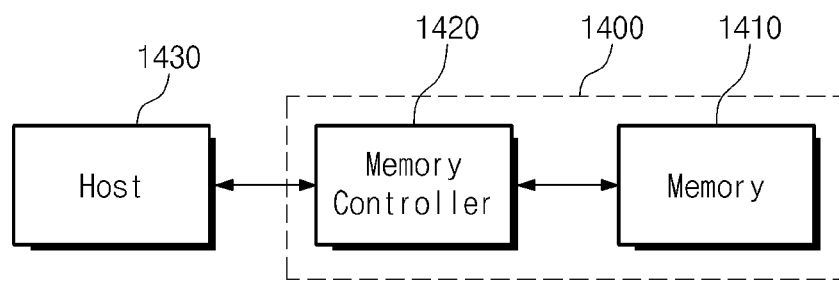
FIG. 10 illustrates a block diagram of an example of a memory system including the semiconductor package according to an embodiment.

The semiconductor package according to an embodiment may be part of a memory card. FIG. 10 illustrates a block diagram of an example of a memory system including the semiconductor package according to an embodiment.

Referring to FIG. 10, a memory card 1400 may include a nonvolatile memory device 1410 and a memory controller 1420. The nonvolatile memory device 1410 and the memory controller 1420 may be capable of storing data or reading stored data. The nonvolatile memory device 1410 may include a nonvolatile memory device to which the semiconductor package according to an embodiment is applied. The memory controller 1420 may be configured to control the flash memory device 1410 so as to read stored data or store data in response to the reading/writing request of the host.

According to some embodiments, the bottom semiconductor package may comprise the heat dissipation layer whose area is greater than that of the lower semiconductor chip, in a plan view. The bottom semiconductor package may therefore have superior heat dissipation characteristics.

According to a method according to an embodiment, the formation of the lower molding layer may follow the formation of the pillar section electrically connecting the redistribution pattern to the top semiconductor package. Consequently, it may be possible to more easily connect the top semiconductor package to the redistribution pattern and to reduce contact failure therebetween.

Embodiments include a semiconductor package having improved heat dissipation characteristics.

Embodiments include a method for fabricating a semiconductor package having enhanced heat dissipation characteristics and reliability.

According to an embodiment, a semiconductor package may comprise: a bottom semiconductor package; a top semiconductor package on the bottom semiconductor package; and a connection member between the bottom semiconductor package and the top semiconductor package. The bottom semiconductor package may comprise: a redistribution pattern including a central chip region and an interconnection region surrounding the central region; a lower semiconductor chip that is disposed on the chip region and is electrically connected to the redistribution pattern; a connection pillar that is disposed on the interconnection region and electrically connects the connection member to the redistribution pattern; a first heat dissipation layer on the lower semiconductor chip; a second heat dissipation layer on the first heat dissipation layer; and a lower molding layer encapsulating the redistribution pattern and the lower semiconductor chip, the second heat dissipation layer including a first protrusion projecting out of a sidewall thereof toward the connection pillar.

In an embodiment, at least a portion of the second heat dissipation layer may extend onto the interconnection region.

In an embodiment, the first protrusion may extend onto the interconnection region.

In an embodiment, the second heat dissipation layer may have an area greater than that of the lower semiconductor chip in a plan view.

In an embodiment, the connection pillar may comprise: a pillar section; and a second protrusion extending from a sidewall of the pillar section toward the second heat dissipation layer.

In an embodiment, the first and second protrusions may be disposed at the same level.

In an embodiment, the first and second protrusions may have the same thickness.

In an embodiment, the second heat dissipation layer may comprise a top surface having the same level as a top surface of the connection pillar.

According to an embodiment, a method for fabricating a semiconductor package may comprise: forming a first heat dissipation layer on a lower semiconductor chip; forming a preliminary heat dissipation layer including a body, a protrusion projected from a sidewall of the body, and a pillar section in contact with the protrusion and not in contact with the body; forming a lower molding layer covering a sidewall of the lower semiconductor chip, a sidewall of the first heat dissipation layer, and a sidewall of the preliminary heat dissipation layer; forming a redistribution pattern under the lower semiconductor chip, the redistribution pattern electrically connected to the lower semiconductor chip and the pillar section; removing a portion of the protrusion to define a second heat dissipation layer including the body and define a connection pillar that includes the pillar section and is spaced apart from the second heat dissipation layer; and mounting a top semiconductor package on the second heat dissipation layer.

In an embodiment, forming the first heat dissipation layer on the lower semiconductor chip may comprise: forming the first heat dissipation layer on a wafer including a plurality of the lower semiconductor chips formed thereon; and sawing the wafer to separate the plurality of the lower semiconductor chips from each other.

In an embodiment, at least a portion of the protrusion may be not vertically overlapped with the lower semiconductor chip.

In an embodiment, forming the preliminary heat dissipation layer may comprise placing the pillar section in position surrounding the lower semiconductor chip.

In an embodiment, the pillar section may have a bottom surface having the same level as a bottom surface of the lower semiconductor chip.

In an embodiment, removing the portion of the protrusion may comprise: forming a first protrusion that is included in the second heat dissipation layer and in contact with the body; and forming a second protrusion that is included in the connection pillar and in contact with the pillar section.

In an embodiment, the second heat dissipation layer may have an area greater than that of the lower semiconductor chip in a plan view.

Although embodiments have been described in connection with the particular embodiments illustrated in the accompanying drawings, it is not limited thereto. It will be apparent to those skilled in the art that various substitution, modifications and changes may be thereto without departing from the scope and spirit as defined by the following claims.

What is claimed is:

1. A semiconductor package comprising:
   a semiconductor chip;
   a connection pillar that is disposed adjacent to the semiconductor chip in plan view;
   a first heat dissipation layer disposed on the semiconductor chip; and
   a second heat dissipation layer disposed on the first heat dissipation layer,
   the second heat dissipation layer including a body and a first protrusion,
   the first protrusion being disposed adjacent to the connection pillar, projecting toward the connection pillar from one of sidewalls of the body, and being separate from the connection pillar,
   wherein the first heat dissipation layer is disposed between the semiconductor chip and the second heat dissipation layer, and
   wherein the second heat dissipation layer comprises a top surface having substantially the same level as a top surface of the connection pillar.

2. The semiconductor package of claim 1, further comprising a molding layer encapsulating the semiconductor chip.

3. The semiconductor package of claim 1, wherein the first protrusion extends beyond a perimeter of the semiconductor chip.

4. The semiconductor package of claim 1, wherein the second heat dissipation layer has an area greater than that of the semiconductor chip in a plan view.

5. The semiconductor package of claim 1, wherein the connection pillar comprises:
   a vertical pillar section; and
   a second protrusion extending horizontally from a sidewall of the vertical pillar section toward the first protrusion of the second heat dissipation layer.

6. The semiconductor package of claim 5, wherein the first and second protrusions are disposed at substantially the same level.

7. The semiconductor package of claim 5, wherein the first and second protrusions have substantially the same thickness.

8. The semiconductor package of claim 1, wherein:
   in plan view, the first protrusion projects in a first direction from the one of the sidewalls of the body and has a first width in a second direction perpendicular to the first direction and parallel to the semiconductor chip,
   in plan view, the connection pillar has a second width in the second direction, and
   the first width is substantially the same as the second width.

9. The semiconductor package of claim 1, further comprising:
   a redistribution pattern including a chip region and an interconnection region surrounding the chip region; and
   a molding layer;
   wherein:
      the semiconductor chip is disposed on the chip region and is electrically connected to the redistribution pattern;
      the connection pillar is disposed on the interconnection region and is electrically connected to the redistribution pattern; and
      the molding layer encapsulates the redistribution pattern and the semiconductor chip.

10. The semiconductor package of claim 1, further comprising a molding layer encapsulating the semiconductor chip, wherein the molding layer is not disposed between the first protrusion and the connection pillar.

* * * * *